United States Patent
Hilgemberg Pontes et al.

(10) Patent No.: US 9,921,992 B2
(45) Date of Patent: Mar. 20, 2018

(54) ASYNCHRONOUS DATA LINK

(71) Applicant: Commissariat à l'Énergie Atomique et aux Énergies Alternatives, Paris (FR)

(72) Inventors: Julian Hilgemberg Pontes, Grenoble (FR); Pascal Vivet, Saint Paul de Varces (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 135 days.

(21) Appl. No.: 14/981,478

(22) Filed: Dec. 28, 2015

(65) Prior Publication Data

US 2016/0188522 A1   Jun. 30, 2016

(30) Foreign Application Priority Data

Dec. 29, 2014   (FR) ..................................... 14/63384
Jan. 14, 2015   (FR) ..................................... 15/50288

(51) Int. Cl.
   *G06F 13/42*   (2006.01)
   *G06F 15/78*   (2006.01)
   *H03K 19/096*  (2006.01)

(52) U.S. Cl.
   CPC ...... *G06F 13/4226* (2013.01); *G06F 13/4252* (2013.01); *G06F 15/7825* (2013.01); *H03K 19/0966* (2013.01); *Y02B 60/1228* (2013.01); *Y02B 60/1235* (2013.01)

(58) Field of Classification Search
   CPC ............. G06F 13/4226; G06F 13/4252; G06F 15/7825; H03K 19/0966
   See application file for complete search history.

(56) References Cited

U.S. PATENT DOCUMENTS

| | | | |
|---|---|---|---|
| 2006/0001445 A1 | 1/2006 | Liang et al. | |
| 2011/0121857 A1* | 5/2011 | Nowick | ............... H03K 19/173 326/54 |
| 2013/0073771 A1 | 3/2013 | Hanyu et al. | |

OTHER PUBLICATIONS

Search Report, dated Nov. 16, 2015, from corresponding French Patent Application No. 15/50288.
Lafrieda et al: "An Asynchronous FPGA with Two Phase Enabled-Scaled Routing," Asynchronus Circuits and Systems (ASYNC), 2010 IEEE Symposium; pp. 141-150.
Taylor et al: "Reduced Complexity Two-Phase Micropipeline Latch Controller," IEEE Journal of Solid-State Circuits; 1998; pp. 1590.

(Continued)

*Primary Examiner* — Ernest Unelus
(74) *Attorney, Agent, or Firm* — Wolf, Greenfield & Sacks, P.C.

(57) ABSTRACT

A two-phase asynchronous transmission circuit for transmitting data over a wired interface according to a two-phase asynchronous protocol, the transmission circuit including: N data output lines, where N is an integer equal to 3 or more, wherein the transmission circuit is capable of transmitting N unique data symbols, each of the output lines being associated with a corresponding one of the N data symbols, and the transmission circuit is adapted to transmit each data symbol by applying a voltage transition to the corresponding output line independently of the voltage state of the other output lines.

16 Claims, 4 Drawing Sheets

(56) References Cited

OTHER PUBLICATIONS

Cannizzaro et al.: "PID (Partial Inversion Data): an M-of-N Level-Encoded Transition Signaling Protocol for Asynchronous Global Communication," (2012) IEEE $18^{th}$ International Symposium on Asynchronous Circuits and Systems; pp. 134-141.
McLaughlin et al.: "Asynchronous Protocol Converters for Two-Phase Delay-Insensitive Global Communication," (2009) IEEE Transactions on Very Large Scale Integration (VLSI) Systems; pp. 923-928.
Vivet: "Un Methodologie de Conception de Circuits Integres Quasi-Insensibles Aux Delais: Application a L' Etude et a la Realisation D'Un Processeur RISC 16-Bit Asynchrone," (2001) PhD thesis.
McGee et al.: "A level-Encoded Transition Signaling Protocol for High-Throughput Asynchronous Global Communication," Department of Computer Science, Columbia University.
Sparsø et al.: "Principles of Asynchronous Circuit Design—A Systems Perspective," Techincal Univeristy of Denmark; pp. 1-354.

\* cited by examiner

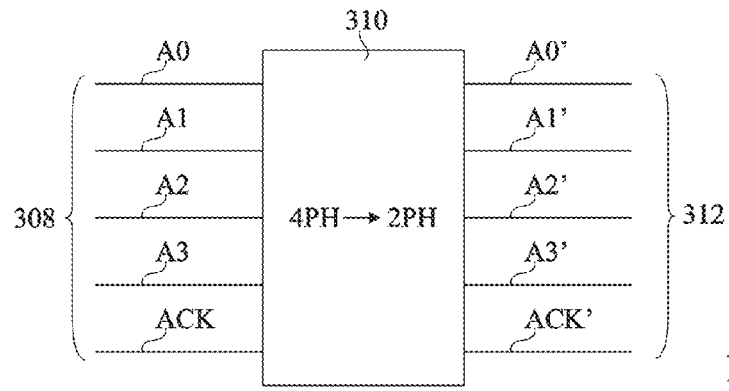
Fig 5A
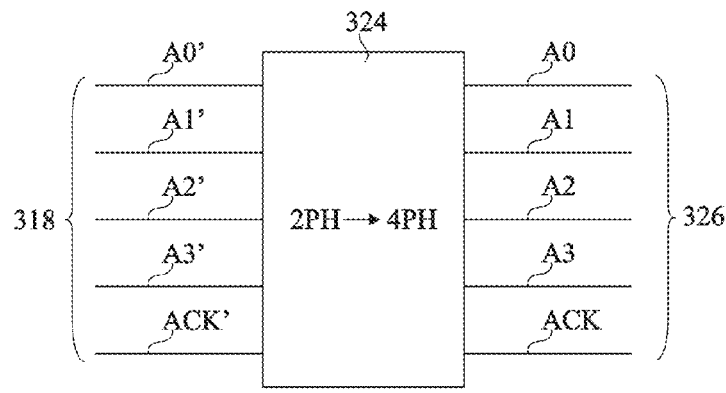
Fig 5B
| | A3 | A2 | A1 | A0 |
|---|---|---|---|---|
| SPACER | 0 | 0 | 0 | 0 |
| "0" | 0 | 0 | 0 | 1 |
| "1" | 0 | 0 | 1 | 0 |
| "2" | 0 | 1 | 0 | 0 |
| "3" | 1 | 0 | 0 | 0 |
Fig 6A
| | A3 | A2 | A1 | A0 |
|---|---|---|---|---|
| "0" | – | – | – | T |
| "1" | – | – | T | – |
| "2" | – | T | – | – |
| "3" | T | – | – | – |
Fig 6B

ASYNCHRONOUS DATA LINK

CROSS-REFERENCE TO RELATED APPLICATIONS

This application claims the priority benefit to French Patent Application No. 14/63384, filed Dec. 29, 2014, and French Patent Application No. 15/50288, filed Jan. 14, 2015, which applications are hereby incorporated by reference to the maximum extent allowable by law

FIELD

The present disclosure relates to the field of asynchronous communications, and in particular to a two-phase asynchronous transmission circuit, a two-phase asynchronous reception circuit and to an asynchronous data link.

BACKGROUND

The design of a fully synchronous system on chip is becoming a challenging task, particularly for advanced nodes and 3D designs. Indeed, local and global variability means that the timing closure is becoming an overwhelming task.

The Globally Asynchronous Locally Synchronous (GALS) design style provides a useful alternative to a fully synchronous approach, as it provides improved robustness against local and inter-die variability. For example, asynchronous communications may be implemented using Quasi Delay Insensitive (QDI) protocols, which have the advantage of being almost free of timing constraints. In view of its similarities to standard binary signals, the use of four-phase QDI encoding is often a preferred choice for on chip communications. A four-phase asynchronous protocol involves implementing, for each data symbol to be transmitted, a handshake protocol involving four transmission phases.

A difficulty is that the use of four-phase asynchronous protocols for communications off chip and over 3D interfaces tends to introduce unacceptable interface delays, and leads to high dynamic power consumption.

Two-phase transmissions protocols provide an interesting alternative to four-phase protocols for off chip communications. However, existing two-phase transmission protocols tend to be complex to implement.

There is thus a need in the art for an asynchronous protocol allowing data communications with relatively low interface delays, low dynamic power consumption, and/or permitting relatively high data throughput. There is also a need for relatively simple and compact circuits for implementing such an asynchronous protocol.

SUMMARY

It is an aim of embodiments of the present description to at least partially address one or more needs in the prior art.

According to one aspect, there is provided a two-phase asynchronous transmission circuit for transmitting data over a wired interface according to a two-phase asynchronous protocol, the transmission circuit comprising: N data output lines, where N is an integer equal to 3 or more, wherein the transmission circuit is capable of transmitting N unique data symbols, each of the output lines being associated with a corresponding one of the N data symbols, and the transmission circuit is adapted to transmit each data symbol by applying a voltage transition to the corresponding output line independently of the voltage state of the other output lines.

According to a further aspect, there is provided a four-phase to two-phase asynchronous protocol converter comprising: the above transmission circuit; and N data input lines, each of the input lines being associated with a corresponding one of the N data symbols, wherein the transmission circuit is adapted to generate each symbol to be transmitted by detecting a first logic state on a corresponding one of the N data input lines.

According to a further aspect, there is provided a four-phase to two-phase asynchronous protocol converter comprising: a transmission circuit comprising: N data output lines, where N is an integer equal to 2 or more, wherein the transmission circuit is capable of transmitting N unique data symbols, each of the output lines being associated with a corresponding one of the N data symbols, and the transmission circuit is adapted to transmit each data symbol by applying a voltage transition to the corresponding output line; and N data input lines, each of the input lines being associated with a corresponding one of the N data symbols, wherein the transmission circuit is adapted to generate each symbol to be transmitted by detecting a first logic state on a corresponding one of the N data input lines, and wherein the transmission circuit comprises, for each of the N input data lines, a logic circuit having an input coupled to the corresponding data input line and adapted to generate a transition at its output in response to an active edge on the input data line, the active edge corresponding to either a falling edge or a rising edge.

According to one embodiment, each logic circuit comprises a flip-flop, and wherein: the input of the logic circuit is a clock input of the flip-flop coupled to the corresponding input data line; and the output of the flip-flop is coupled to a data input of the flip-flop via an inverter, the output of the flip-flip being connected to one of the output lines.

According to one embodiment, the four-phase to two-phase converter further comprises: a two-phase acknowledgement input line for receiving a two-phase acknowledgement signal indicating that a data symbol has been successfully received, wherein the two-phase acknowledgement signal comprises a voltage transition on the two-phase acknowledgement input line; a four-phase acknowledgement output line for transmitting a four-phase acknowledgement signal indicating that a data symbol has been successfully received; and a four-phase acknowledgement generation circuit adapted to generate the four-phase acknowledgement signal based on the two-phase acknowledgement signal.

According to one embodiment, the four-phase acknowledgement signal comprises, in response to the reception of each data symbol, the application of a second voltage state on the four-phase acknowledgement output line, and in response to the reception of a spacer by the four-phase to two-phase converter, the application of the first voltage state on the four-phase acknowledgement output line, and wherein the four-phase acknowledgement generation circuit is adapted to apply the second voltage state on the four-phase acknowledgement output line when an active edge is detected on one of the N data input lines, and to apply the first voltage state on the four-phase acknowledgement output line when a transition is detected on one of the N data output lines and on a two-phase acknowledgement input line.

According to one embodiment, the four-phase acknowledgement generation circuit comprises a first XOR gate adapted to apply the XOR function to the N data output lines and a second XOR gate having one input coupled to the output of the first XOR gate and another input coupled to the two-phase acknowledgement input line.

According to one embodiment, the four-phase acknowledgement generation circuit further comprises a NOR gate having N inputs coupled respectively to the N input lines, and an asymmetric C-element having a first input coupled to an output of the NOR gate and a second input coupled to an output of second XOR gate via an inverter, wherein the asymmetric C-element is adapted to generate a rising edge on the four-phase acknowledgement output line in response to rising edges at the outputs of the NOR gate and the inverter, and to generate a falling edge on the four-phase acknowledgement output line in response to a falling edge at the output of the NOR gate.

According to a further aspect, there is provided a two-phase asynchronous reception circuit for receiving data encoded according to a two-phase asynchronous protocol, the reception circuit comprising: N data input lines, where N is an integer equal to 3 or more, wherein the reception circuit is capable of receiving N unique data symbols, each of the data input lines being associated with a corresponding one of the N data symbols, and wherein the reception circuit is adapted to generate each data symbol by detecting a voltage transition on a corresponding one of the data input lines independently of the voltage state of the other data input lines.

According to a further aspect, there is provided a two-phase to four-phase asynchronous protocol converter comprising: the above reception circuit; and N data output lines, each of the data output lines being associated with a corresponding one of the N data symbols, wherein the reception circuit is adapted to transmit each data symbol by applying a first logic state on a corresponding one of the data output lines.

According to one embodiment, the two-phase to four-phase converter further comprising a four-phase acknowledgement input line for receiving a four-phase acknowledgement signal indicating that a data symbol has been successfully received, wherein the four-phase acknowledgement signal comprises, in response to the reception of each data symbol, the application of a second logic state on the four-phase acknowledgement input line, and in response to the transmission of a spacer by the reception circuit, the application of a first logic state on the four-phase acknowledgement output line.

According to a further aspect, there is provided a two-phase to four-phase asynchronous protocol converter comprising: a reception circuit for receiving data encoded according to a two-phase asynchronous protocol, the reception circuit comprising: N data input lines, where N is an integer equal to 2 or more, wherein the reception circuit is capable of receiving N unique data symbols, each of the data input lines being associated with a corresponding one of the N data symbols, and wherein the reception circuit is adapted to generate each data symbol by detecting a voltage transition on a corresponding one of the data input lines; and N data output lines, each of the data output lines being associated with a corresponding one of the N data symbols, wherein the reception circuit is adapted to transmit each data symbol by applying a first logic state on a corresponding one of the data output lines; the reception circuit comprising, for each data input line: a first latch having an input coupled to the data input line; a second latch having an input coupled to an output of the first latch; and a logic gate coupled to the output of the first latch and to an output of the second latch and adapted to generate a data symbol.

According to one embodiment, the first latches are enabled by a first logic state of the four-phase acknowledgement signal and the second latches are enabled by a second logic state of the four-phase acknowledgement signal.

According to one embodiment, the two-phase to four-phase converter further comprises: a two-phase acknowledgement output line for transmitting a two-phase acknowledgement signal indicating that a data symbol has been successfully received, wherein the two-phase acknowledgement signal comprises a voltage transition on the two-phase acknowledgement output line; and a two-phase acknowledgement generation circuit adapted to generate the two-phase acknowledgement signal by detecting a transition at the output of one of the second latches.

According to a further aspect, there is provided a data link comprising: the above two-phase transmission circuit; the above two-phase reception circuit; and a wired interface comprising N lines interconnecting the N output lines of the two-phase transmission circuit to the N input lines of the two-phase reception circuit. According to one embodiment, the wired interface comprises a 3D via.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 5A schematically illustrates a four-phase to two-phase asynchronous protocol converter according to an example embodiment of the present disclosure;

FIG. 5B schematically illustrates a two-phase to four-phase asynchronous protocol converter according to an example embodiment of the present disclosure;

FIG. 6A is a table representing a four-phase asynchronous protocol using four data lines according to an example embodiment of the present disclosure;

FIG. 6B is a table representing a two-phase asynchronous protocol using four data lines according to an example embodiment of the present disclosure;

DETAILED DESCRIPTION

Figure 1:
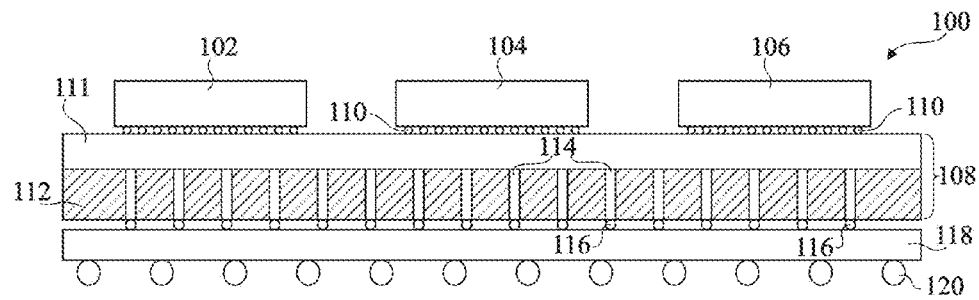
FIG. 1 is a cross-section view of a system level 3D interconnection according to an embodiment of the present disclosure.

FIG. 1 is a cross-section view schematically illustrating a system level 3D interconnection using 3D technology. In the example of FIG. 1, there are three integrated circuits 102, 104 and 106 interconnected by a silicon interposer 108. Each of the integrated circuits 102 to 106 may use different voltage levels and/or different operating frequencies, and it can be designed with different technologies. The integrated circuits 102 to 106 are for example coupled to the silicon interposer 108 by microbumps 110. The interposer 108 for example comprises an interconnection level 111, and a silicon layer 112 through which one or more Through Silicon Vias (TSV) 114 are formed. The TSVs 114 are each connected to a corresponding flip chip bump 116, which is in turn connected to a package substrate 118. The package substrate 118 is for example further coupled via BGA (ball grid array) balls 120 to a motherboard or the like.

The microbumps 110, TSVs 114 and flip chip bumps 116 of the interposer 108 provide 3D interfaces between the integrated circuits 102, 104 and 106 and/or with other circuits. However, a difficulty is that these elements introduce propagation delays. Furthermore the interposer 108 may comprise test logic and/or micro-buffer cells (not illustrated in FIG. 1) comprising buffers, ESD (electrostatic discharge) protection circuits and/or level shifters, adding further propagation delays to the signals transmitted to or from the integrated circuits 102, 104, 106.

Figure 2:
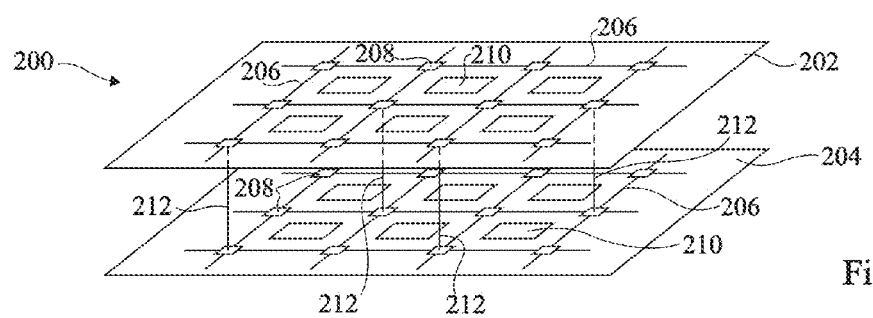
FIG. 2 is a perspective view schematically illustrating a 3D architecture comprising a pair of stacked integrated circuits according to an embodiment of the present disclosure.

FIG. 2 illustrates an example of a 3D circuit design comprising an integrated circuit 202 superposed over an integrated circuit 204. Each of the integrated circuits 202, 204 for example comprises a network-on-chip (NoC) comprising a grid of interconnecting buses 206, with a router 208 at each crossing point between the buses 206. Each router 208 is for example coupled to a corresponding processing device 210 provided on each integrated circuit 202, 204. At least some of the interconnection routers 208 of the integrated circuit 202 are coupled, via 3D interfaces 212 for example comprising TSVs, with interconnection routers 208 of the integrated circuit 204.

Again, the 3D interfaces 212 of the embodiment of FIG. 2 for example introduce propagation delays. Therefore, while at least some of the on chip communications over the buses 206 of each integrated circuit 202, 204 may be performed using an asynchronous four-phase protocol, the use of such a protocol over the 3D interfaces 212 is likely to lead to unacceptable propagation delays and thus low data throughput and high dynamic power consumption.

Figure 3:
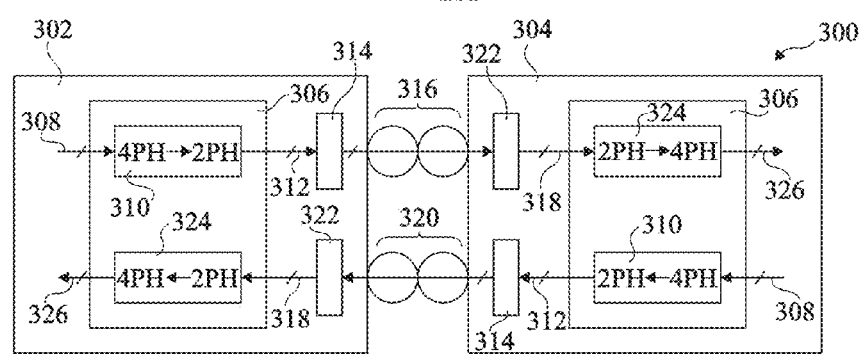
FIG. 3 schematically illustrates a data link according to an embodiment of the present disclosure.

FIG. 3 schematically illustrates a data link 300, which is for example used for communications between the interposer 108 and the integrated circuits 102, 104 and 106 in FIG. 1, and/or between the integrated circuits 202 or 204 of FIG. 2.

The data link 300 comprises circuits 302 and 304 that communicate with each other using a two-phase transition encoding asynchronous protocol.

The circuit 302 for example comprises a protocol conversion circuit 306 coupled to input lines 308 for receiving data symbols transmitted according to a four-phase asynchronous protocol. For example, while not shown in FIG. 3, the signals on the input lines 308 are provided by a further transmission interface that uses the four-phase asynchronous protocol.

The circuit 306 comprises a four-phase to two-phase asynchronous protocol converter 310 having inputs coupled to the lines 308, and providing, on output lines 312, data symbols encoded according to a two-phase asynchronous protocol. The lines 312 are for example coupled via an interface circuit 314, for example comprising buffers, ESD protection circuits and/or level shifters, to a wired interface 316. The wired interface 316 for example comprises a 3D interface, such as a TSV, or other type of 2D or 3D connection.

The circuit 302 also receives on lines 318 data symbols transmitted according to the two-phase asynchronous protocol. The lines 318 are for example coupled to a further wired interface 320 between the circuits 302 and 304 via a further interface circuit 322. The lines 318 are provided to a two-phase to four-phase asynchronous protocol converter 324, which provides, on output lines 326, data symbols encoded according to the four-phase asynchronous protocol. For example, the output lines 326 are coupled to a further transmission interface that uses the four-phase asynchronous protocol.

The circuit 304 for example comprises the same elements as the circuit 302, which are labelled with like reference numerals and will not be described again in detail. However, the converter 310 in the circuit 304 has its output lines 312 coupled to the wired interface 320, for example via the 3D interface circuit 314, and the converter 324 in the circuit 304 has its input lines 318 coupled to the wired interface 316, for example via the 3D interface circuit 322.

Figure 4A:
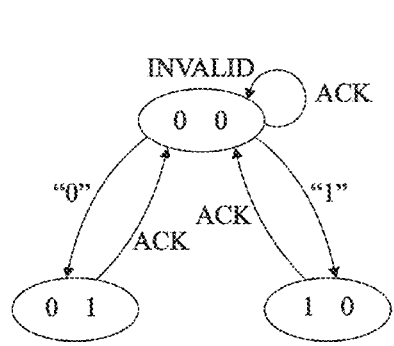
FIG. 4A is a state diagram showing an example of a four-phase asynchronous protocol over two data lines according to an example embodiment.

FIG. 4A is a state diagram illustrating an example of a four-phase asynchronous protocol based on two data lines, which we will call A0 and A1, and a single acknowledgement wire. There are three states, a state 00 in which both lines A0 and A1 are at a low logic level, a state 01 in which the line A1 is at a low logic level and the line A0 is at a high logic level, and a state 10 in which the line A1 is at a high logic level and the line A0 is at a low logic level.

From the initial state 00, in a first phase a binary "0" is transmitted by moving to the state 01, in other words by bringing the line A0 to a high logic level, or a binary "1" is transmitted by moving to the state 10, in other words by bringing the line A1 to a high logic level. In a second phase, an acknowledgement signal ACK is received, causing, in a third phase, a return to the state 00, by bringing both of the lines A0 and A1 to a low logic level. This corresponds to a spacer separating transmission of consecutive data symbols. In the fourth phase, another acknowledgement signal ACK is received, meaning that a new data symbol may be transmitted.

Thus, according to the four-phase asynchronous protocol, the data is encoded in a way quite closely resembling standard binary signals. Each line is associated with one of the data symbols, in this example a "0" and a "1". A logic high state on each line is used to represent each data symbol.

Figure 4B:
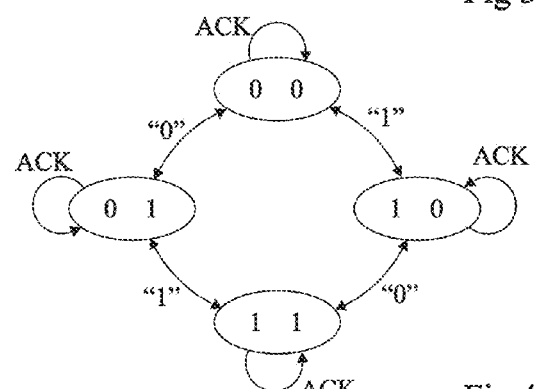
FIG. 4B is a state diagram showing an example of a two-phase transition encoding asynchronous protocol over two data lines according to an example embodiment.

FIG. 4B is a state diagram illustrating an example of a two-phase asynchronous protocol, which will be called herein a two-phase transition encoding asynchronous protocol. The example of FIG. 4B is based on two data lines, which we will again call A0 and A1, and a single acknowledgement wire. There are four states, a state 00 in which both lines A0 and A1 are at a low logic level, a state 01 in which the line A1 is at a low logic level and the line A0 is at a high logic level, a state 10 in which the line A1 is at a high logic level and the line A0 is at a low logic level, and a state 11 in which both lines are at a high logic level.

From any initial state, the data symbol "0" is encoded by a voltage transition on the line A0, and the data symbol "1"

is encoded by a voltage transition on the line A1, independently of the state of the other line. As used herein, a voltage transition means a transition from a low logic level to a high logic level or from a high logic level to a low logic level.

Thus, starting in the state 00, in a first phase, a binary "0" is transmitted by moving to the state 01, in other words by bringing the line A0 to a high logic level, or a binary "1" is transmitted by moving to the state 10, in other words by bringing the line A1 to a high logic level. In a second phase, an acknowledgement signal ACK is received. A new data symbol can then be transmitted. For example, from the state 01, a binary "1" is transmitted by moving to the state 11, in other words by bringing the line A1 to a high logic level, or a binary "0" is transmitted by moving back to the state 00, in other words by bringing the line A0 to a low logic level. From the state 11, a binary "1" is transmitted by moving to the state 01, in other words by bringing the line A1 to a low logic level, or a binary "0" is transmitted by moving to the state 10, in other words by bringing the line A0 to a low logic level. From the state 10, a binary "1" is transmitted by moving to the state 00, in other words by bringing the line A1 to a low logic level, or a binary "0" is transmitted by moving to the state 11, in other words by bringing the line A0 to a high logic level.

Thus, the two-phase asynchronous protocol is similar to the four-phase asynchronous protocol in that each line is again associated with one of the data symbols. However, the data symbol is selected by a transition, rather than by a high logic level, on a given line.

FIG. 5A schematically illustrates the inputs and outputs of the four-phase to two-phase converter 310 of FIG. 3 in more detail according to an example in which the input lines 308 comprise four data lines labelled A0, A1, A2 and A3 and an acknowledgement line ACK, and the output lines 312 comprise four data lines labelled A0', A1', A2' and A3', and an acknowledgement line ACK'.

FIG. 5B schematically illustrates the inputs and outputs of the two-phase to four-phase converter 324 of FIG. 3 in more detail according to an example in which the input lines 318 comprise four data lines labelled A0', A1', A2' and A3' and an acknowledgement line ACK', and the output lines 326 comprise four data lines labelled A0, A1, A2 and A3, and an acknowledgement line ACK.

FIG. 6A is a table representing the four-phase asynchronous protocol of FIG. 4A adapted to the four data lines A0, A1, A2 and A3 of FIGS. 5A and 5B.

There are for example four unique data symbols labelled "0", "1", "2", "3", which for example respectively correspond to binary values 00, 01, 10 and 11. Each symbol "0" to "3" is associated with a corresponding one of the lines A0 to A3, such that a high logic level on a given line transmits the corresponding data symbol.

FIG. 6B is a table representing the two-phase asynchronous protocol of FIG. 4B adapted to the four data lines A0', A1', A2' and A3' of FIGS. 5A and 5B. Each symbol "0" to "3" is associated with a corresponding one of the lines A0' to A3', such that a voltage transition on a given line transmits the corresponding data symbol, independently of the voltage state on the other lines.

While the examples of FIGS. 5A, 5B, 6A and 6B involve four data lines for the four-phase signals and for the two-phase signals, in other embodiments there could be N data lines used for transmitting the data symbols of each protocol, where N is for example an integer equal to or greater than 2, and in some embodiments is an integer equal to or greater than 3.

Figure 7A:
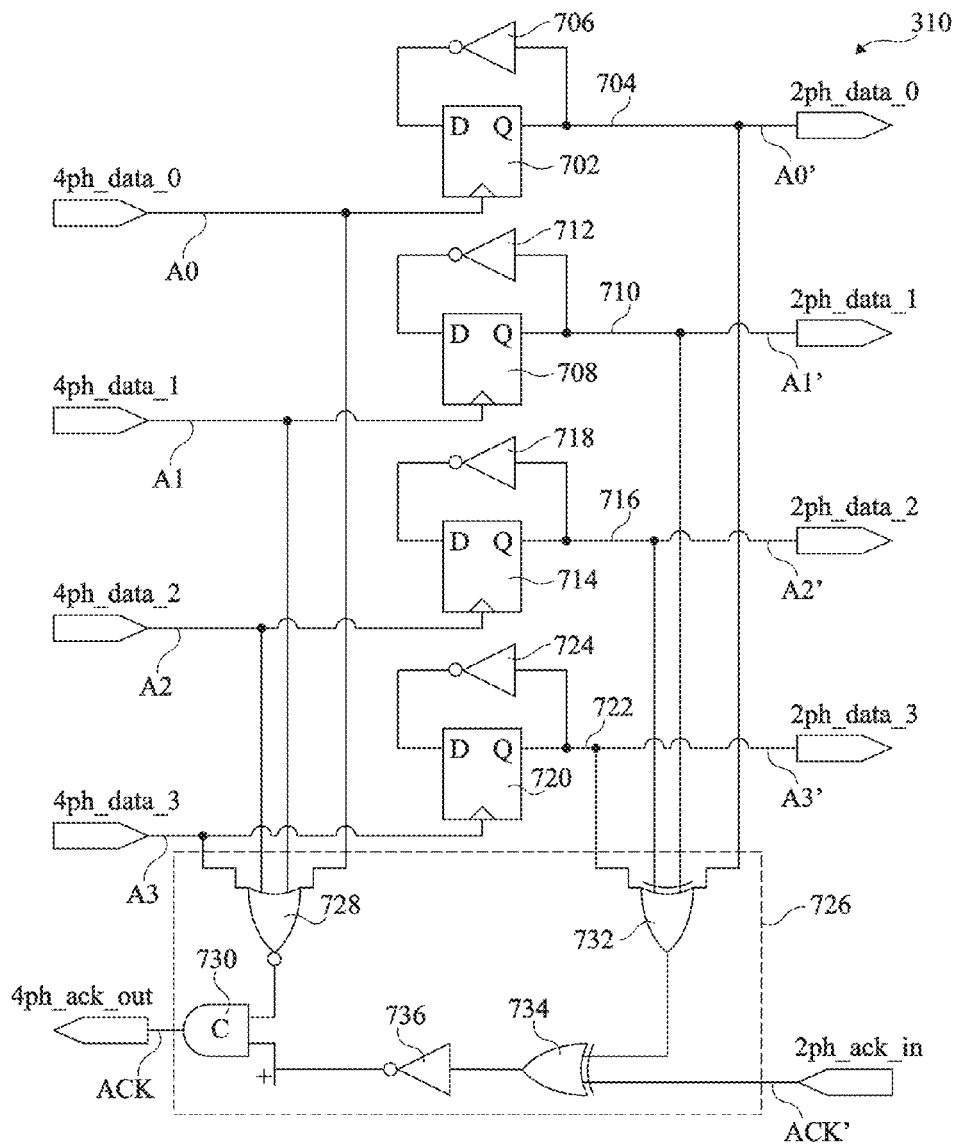
FIG. 7A schematically illustrates a four-phase to two-phase asynchronous protocol converter according to an example embodiment of the present disclosure.

FIG. 7A schematically illustrates the four-phase to two-phase converter 310 of FIG. 5A in more detail according to an example embodiment.

The data line A0 receives a signal 4ph_data_0 and is coupled to a clock input of a flip-flop 702. The flip-flop 702 has its Q output 704 coupled to the data line A0' of the two-phase protocol. The output 704 is also coupled, via an inverter 706, to the data input of the flip-flop 702.

The data line A1 receives a signal 4ph_data_1 and is coupled to a clock input of a flip-flop 708. The flip-flop 708 has its Q output 710 coupled to the data line A1' of the two-phase protocol. The output 710 is also coupled, via an inverter 712, to the data input of the flip-flop 708.

The data line A2 receives a signal 4ph_data_2 and is coupled to a clock input of a flip-flop 714. The flip-flop 714 has its Q output 716 coupled to the data line A2' of the two-phase protocol. The output 716 is also coupled, via an inverter 718, to the data input of the flip-flop 714.

The data line A3 receives a signal 4ph_data_3 and is coupled to a clock input of a flip-flop 720. The flip-flop 720 has its Q output 722 coupled to the data line A3' of the two-phase protocol. The output 722 is also coupled, via an inverter 724, to the data input of the flip-flop 720.

The converter 310 also comprises a four-phase acknowledgement generation circuit 726, which provides the acknowledgement signal 4ph_ack_out to the four-phase side on the line ACK, and receives an acknowledgement signal 2ph_ack_in from the two-phase side on the line ACK'. The circuit 726 generates the acknowledgement signal 4ph_ack_out based on the signals 4ph_data_0 to 4ph_data_3 on the lines A0 to A3 and on the signals 2ph_data_0 to 2ph_data_3 on the lines A0' to A3'. For example, the data lines A0 to A3 are coupled to corresponding inputs of a four-input NOR gate 728, which has its output coupled to one input of an asymmetric C element 730, also known as a Müller circuit. The lines A0' to A3' are for example coupled to corresponding inputs of a four-input XOR gate 732, the output of which is coupled to one of two inputs of an XOR gate 734. The other input of the gate 734 is coupled to the line ACK'. The output of the XOR gate 734 is coupled via an inverter 736 to the second input of the asymmetric C element 730.

The XOR gates described herein with two or more inputs have the function of generating a voltage transition at their outputs in response to detecting a voltage transition at any one of their inputs.

The asymmetric C-element 730 for example has an asymmetric fall. For example, it has the following truth table for input A coming from the NOR gate 728, input B coming from the inverter 736, and output Z, where Zn-1 means that the output of the C-element remains unchanged:

| A | B | Z |
|---|---|---|
| 1 | 1 | 1 |
| 1 | 0 | Zn − 1 |
| 0 | 1 | 0 |
| 0 | 0 | 0 |

It is assumed that signals 4ph_data_1 to 4ph_data_3 are initially low and that the input A of the asymmetric C-element is initially at logic 1. It is also assumed that the signal 2ph_ack_in is initially low. Furthermore, the output Q of each flip-flop 702, 708, 714 and 720 is initially low, for example by activation of a reset signal (not represented in FIG. 7A) provided to the flip-flips. Thus the output of the XOR gate 732 is initially low and the input B of the asymmetric C-element is initially high. Furthermore, the output signal 4ph_ack_out of the C-element 730 is then initially high (A and B being high). The means for initializing the circuit are not represented in the figures, but will be easily conceived by those skilled in the art.

Thus the output of the C-element 730, which is initially at a high logic value, will be brought to a low logic level if one of the lines A0 to A3 transitions to a high logic level. The output of the C-element will then be brought high again if all of the lines A0 to A3 are at a low logic level and if the input B returns to a high level in response to a transition occurring on the line ACK' as will be described below.

Operation of the circuit of FIG. 7A will now be described in more detail with reference to the timing diagram of FIG. 7B for an example in which the data symbol "0" is transmitted. It will be apparent to those skilled in the art that operation will be similar for the transmission of the other data symbols.

Figure 7B:
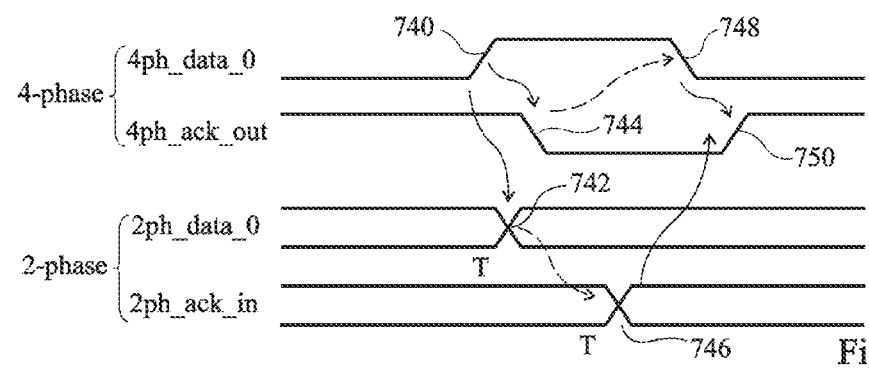
FIG. 7B is a timing diagram showing signals in the converter of FIG. 7A according to an example embodiment.

FIG. 7B illustrates the signals 4ph_data_0 and 4ph_ack_out of the four-phase protocol, and the signals 2ph_data_0 and 2ph_ack_in of the two-phase protocol.

The sequence is initiated by a rising edge 740 of the signal 4ph_data_0. Thus the flip-flop 702 will be clocked by this rising edge, triggering a transition labelled 742 of the signal 2ph_data_0 on the data line A0'.

The transition on the data line A0 causes the output of the NOR gate 728 to go low, thereby bringing the output of the C-element 730 low, as shown by a falling edge 744 of the signal 4ph_ack_out.

Furthermore, the data transition 742 will also cause, sometime later, a transition 746 in the acknowledgement signal 2ph_ack_in on line ACK', which will cause a transition on the input B of the C-element 730, which will become high again. Furthermore, the falling edge 744 of the acknowledgement signal 4ph_ack_out will cause the transmitting circuit to bring the signal 4ph_data_0 low, as shown by a falling edge 748. This corresponds to a spacer transmitted on the data lines A0 to A3, which causes the output of NOR gate 728 to go high. The combination of these events will cause the two inputs of the C-element 730 to go high, thereby causing the acknowledgement signal 4ph_ack_out to go high, as shown by a rising edge 450. The circuit is then ready to receive a subsequent data symbol.

Figure 8A:
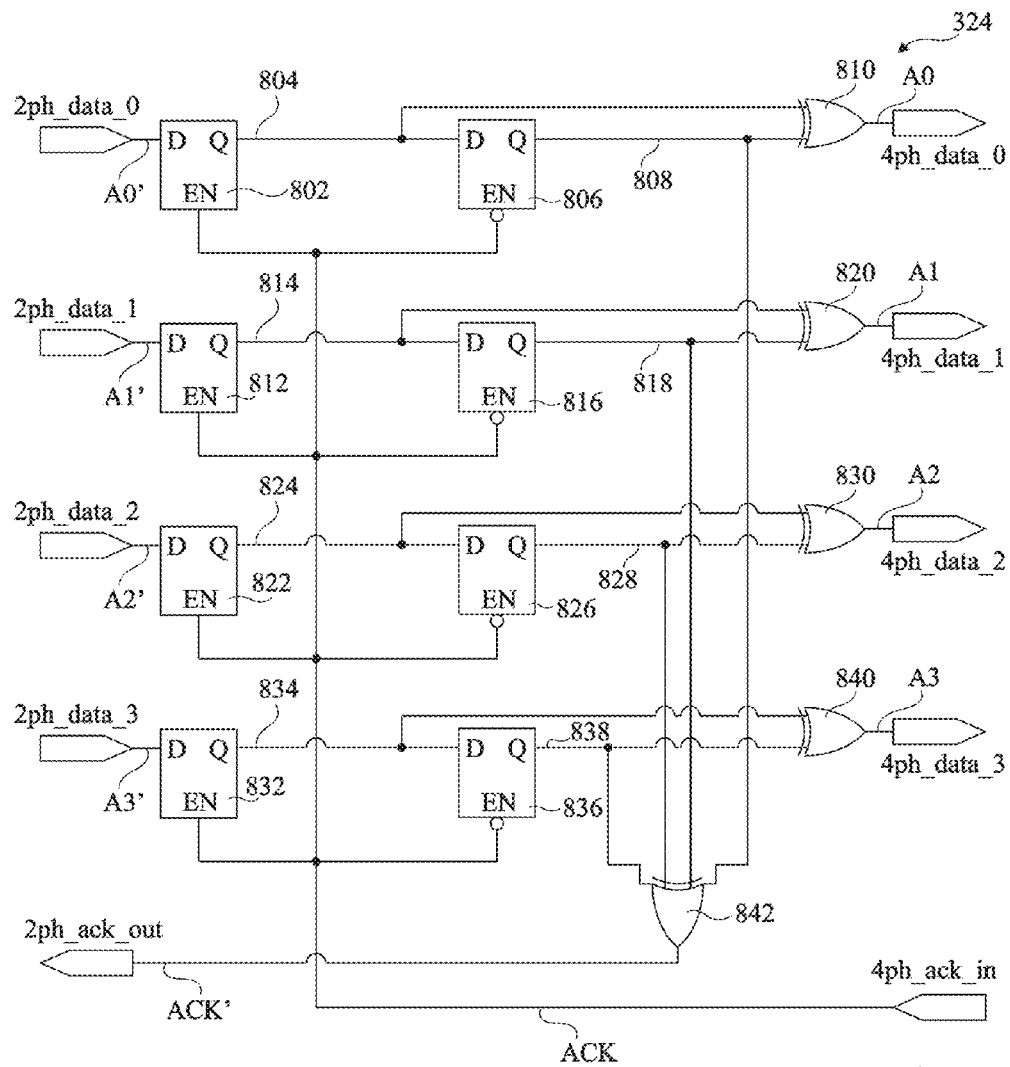
FIG. 8A schematically illustrates a two-phase to four-phase asynchronous protocol converter according to an example embodiment of the present disclosure.

FIG. 8A schematically illustrates the two-phase to four-phase converter 324 of FIG. 5B in more detail according to an example embodiment.

The data line A0' receives a signal 2ph_data_0 and is coupled to a data input of a latch 802. The output 804 of the latch 802 is coupled to a data input of a further latch 806, which has its output 808 coupled to one input of a two-input XOR gate 810. The other input of XOR gate 810 is coupled to the output 804 of latch 802. The output of XOR gate 810 is coupled to the data line A0 of the four-phase protocol.

The data line A1' receives a signal 2ph_data_1 and is coupled to a data input of a latch 812. The output 814 of the latch 812 is coupled to a data input of a further latch 816, which has its output 818 coupled to one input of a two-input XOR gate 820. The other input of XOR gate 820 is coupled to the output 814 of latch 812. The output of XOR gate 820 is coupled to the data line A1 of the four-phase protocol.

The data line A2' receives a signal 2ph_data_2 and is coupled to a data input of a latch 822. The output 824 of the latch 822 is coupled to a data input of a further latch 826, which has its output 828 coupled to one input of a two-input XOR gate 830. The other input of XOR gate 830 is coupled to the output 824 of latch 822. The output of XOR gate 830 is coupled to the data line A2 of the four-phase protocol.

The data line A3' receives a signal 2ph_data_3 and is coupled to a data input of a latch 832. The output 834 of the latch 832 is coupled to a data input of a further latch 836, which has its output 838 coupled to one input of a two-input XOR gate 840. The other input of XOR gate 840 is coupled to the output 834 of latch 832. The output of XOR gate 840 is coupled to the data line A3 of the four-phase protocol.

In the converter 324, the acknowledgement signal 2ph_ack_out on line ACK' is generated by an XOR gate 842 having four inputs coupled respectively to the outputs 808, 818, 828 and 838 of the latches 806, 816, 826 and 836. Furthermore, the acknowledgement signal 4ph_ack_in provided by the four-phase protocol on line ACK is coupled to an enable input of each of the latches 802, 812, 822 and 832, which are each enabled by a logic high value of this signal, and to an enable input of each of the latches 806, 816, 826 and 836, which are each enabled by a logic low value of this signal. Thus the pair of latches associated with each data line is arranged in a master-slave configuration in which data will be latched by the first latch when the signal 4ph_ack_in is high, and then latched by the second latch when the signal 4ph_ack_in is low.

Operation of the circuit of FIG. 8A will now be described in more detail with reference to FIG. 8B for an example in which the data symbol "0" is transmitted. It will be apparent to those skilled in the art that operation will be similar for the transmission of the other data symbols.

Figure 8B:
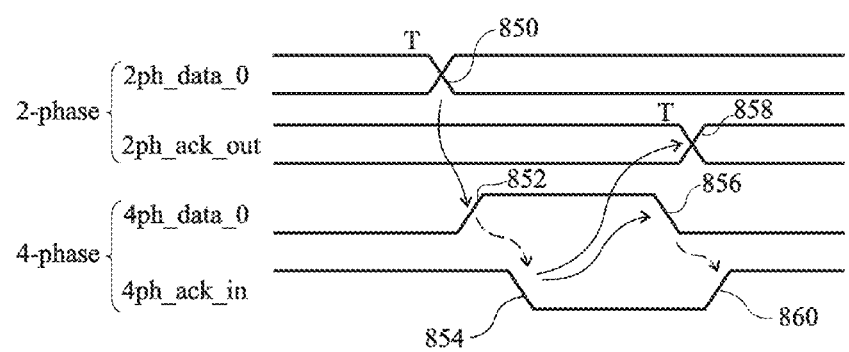
FIG. 8B is a timing diagram showing signals in the converter of FIG. 8A according to an example embodiment.

FIG. 8B is a timing diagram illustrating the signals 2ph_data_0 and 2ph_ack_out of the two-phase protocol, and the signals 4ph_data_0 and 4ph_ack_in of the four-phase protocol.

Initially the acknowledgement signal 4ph_ack_in is at a high logic level, such that the latches 802, 812, 822 and 832 are enabled, whereas the latches 806, 816, 826 and 836 maintain, at their outputs, their previous state.

The sequence is initiated by a transition 850 of the signal 2ph_data_0. This causes a transition at the output 804 of the latch 802, triggering, a short time later, a rising edge 852 of the signal 4ph_data_0. Once this data symbol has been received on the four-phase side, the acknowledgement signal 4ph_ack_in will be brought low, as shown by a falling edge 854. This will cause the latches 806, 816, 826 and 836 to be enabled while the input stages 802, 812, 822 and 832 are disabled, such that the output of latch 806 will equal its input, and the output of XOR gate 810 will go low, as shown by a falling edge 856 of the signal 4ph_data_0. Furthermore, the transition at the output of the latch 808 will cause the signal 2ph_ack_out at the output of the XOR gate 842 to transition, as shown labelled 858. Furthermore, the falling edge 856 of the signal 4ph_data_0 will cause, sometime later, the acknowledgement signal 4ph_ack_in to go high again as shown by a rising edge 860, thereby enabling again the latches 802, 812, 822 and 832 ready for reception of a subsequent data symbol.

An advantage of the two-phase transition encoding asynchronous protocol described herein, with a number of data lines N advantageously equal to 3 or more, is that it provides a relatively high throughput and relatively low dynamic power consumption when compared to a four-phase asynchronous protocol. A further advantage is that by use of such an asynchronous protocol for communications between integrated circuits, the problem of synchronisation between the circuits will be considerably reduced. Furthermore, an advantage of the circuits of FIGS. 7A and 8A for converting between the two-phase and four-phase protocols is that that are compact circuits with relatively few gates and thus relatively low power consumption.

Having thus described at least one illustrative embodiment, various alterations, modifications and improvements will readily occur to those skilled in the art.

For example, while embodiments have been described in FIG. 7A and 8A in which there are four data lines, it will be apparent to those skilled in the art how these circuits could be adapted to any number N of data lines and corresponding data symbols.

Furthermore, it will be apparent to those skilled in the art that the application of the two-phase asynchronous protocol to a 3D interface is merely one example, and that it could be applied to a broad range of interfaces for which the propagation delay is relatively high.

What is claimed is:

1. A four-phase to two-phase asynchronous protocol converter comprising:
    a two-phase asynchronous transmission circuit for transmitting data over a wired interface according to a two-phase asynchronous protocol, the transmission circuit comprising:
        N data output lines, where N is an integer equal to 3 or more, wherein the transmission circuit is capable of transmitting N unique data symbols, each symbol corresponding to a binary value of at least two bits, each of the output lines being associated with a corresponding one of the N data symbols; and
        a two-phase acknowledgement input line for receiving a two-phase acknowledgement signal comprising a voltage transition indicating that a data symbol has been successfully received and permitting a new data symbol to be transmitted, the transmission circuit being configured to transmit each data symbol by applying a voltage transition only to a corresponding output line independently of the voltage state of the other output lines; and
        N data input lines, each of the input lines being associated with a corresponding one of the N data symbols, wherein the transmission circuit is configured to generate each symbol to be transmitted by detecting a first logic state on a corresponding one of the N data input lines.

2. The four-phase to two-phase converter of claim 1, wherein the transmission circuit comprises, for each of the N input data lines, a logic circuit having an input coupled to the corresponding data input line and configured to generate a transition at its output in response to an active edge on the input data line, the active edge corresponding to either a falling edge or a rising edge.

3. The four-phase to two-phase converter of claim 2, wherein each logic circuit comprises a flip-flop, and wherein:
    said input of the logic circuit is a clock input of the flip-flop coupled to the corresponding input data line; and
    the output of the flip-flop is coupled to a data input of the flip-flop via an inverter, the output of the flip-flop being connected to one of the output lines.

4. The four-phase to two-phase converter of claim 1, further comprising:
    a four-phase acknowledgement output line for transmitting a four-phase acknowledgement signal indicating that a data symbol has been successfully received; and
    a four-phase acknowledgement generation circuit configured to generate the four-phase acknowledgement signal based on the two-phase acknowledgement signal.

5. The four-phase to two-phase converter of claim 4, wherein the transmission circuit comprises, for each of the N input data lines, a logic circuit having an input coupled to the corresponding data input line and configured to generate a transition at its output in response to an active edge on the input data line, the active edge corresponding to either a falling edge or a rising edge and wherein the four-phase acknowledgement signal comprises, in response to the reception of each data symbol, the application of a second voltage state on the four-phase acknowledgement output line, and in response to the reception of a spacer by the four-phase to two-phase converter, the application of the first voltage state on the four-phase acknowledgement output line, and wherein the four-phase acknowledgement generation circuit is configured to apply the second voltage state on the four-phase acknowledgement output line when an active edge is detected on one of the N data input lines, and to apply the first voltage state on the four-phase acknowledgement output line when a transition is detected on one of the N data output lines and on the two-phase acknowledgement input line.

6. The four-phase to two-phase converter of claim 4, wherein the four-phase acknowledgement generation circuit comprises a first XOR gate configured to apply the XOR function to the N data output lines and a second XOR gate having one input coupled to the output of the first XOR gate and another input coupled to the two-phase acknowledgement input line.

7. The four-phase to two-phase converter of claim 6, wherein the four-phase acknowledgement generation circuit further comprises a NOR gate having N inputs coupled respectively to the N input lines, and an asymmetric C-element having a first input coupled to an output of the NOR gate and a second input coupled to an output of the second XOR gate via an inverter, wherein the asymmetric C-element is configured to generate a rising edge on the four-phase acknowledgement output line in response to rising edges at the outputs of the NOR gate and the inverter, and to generate a falling edge on the four-phase acknowledgement output line in response to a falling edge at the output of the NOR gate.

8. A four-phase to two-phase asynchronous protocol converter comprising:
    a two-phase asynchronous transmission circuit for transmitting data over a wired interface according to a two-phase asynchronous protocol, the transmission circuit comprising N data output lines, where N is an integer equal to 3 or more, wherein the transmission circuit is capable of transmitting N unique data symbols, each symbol corresponding to binary value of at least two bits, each of the output lines being associated with a corresponding one of the N data symbols, the transmission circuit being configured to transmit each data symbol by applying a voltage transition only to a corresponding output line independently of the voltage state of the other output lines;
    N data input lines, each of the input lines being associated with a corresponding one of the N data symbols, wherein the transmission circuit is configured to generate each symbol to be transmitted by detecting a first logic state on a corresponding one of the N data input lines;
    a two-phase acknowledgement input line for receiving a two-phase acknowledgement signal comprising a voltage transition indicating that a data symbol has been successfully received and permitting a new data symbol to be transmitted, wherein the two-phase acknowledgement signal comprises a voltage transition on the two-phase acknowledgement input line;

a four-phase acknowledgement output line for transmitting a four-phase acknowledgement signal indicating that a data symbol has been successfully received; and a four-phase acknowledgement generation circuit configured to generate the four-phase acknowledgement signal based on the two-phase acknowledgement signal, wherein the four-phase acknowledgement generation circuit comprises a first XOR gate configured to apply the XOR function to the N data output lines and a second XOR gate having one input coupled to the output of the first XOR gate and another input coupled to the two-phase acknowledgement input line.

9. A two-phase to four-phase asynchronous protocol converter comprising:

a two-phase asynchronous reception circuit for receiving data encoded according to a two-phase asynchronous protocol, the reception circuit comprising:

N data input lines, where N is an integer equal to 3 or more, wherein the reception circuit is capable of receiving N unique data symbols, each symbol corresponding to a binary value of at least two bits, each of the data input lines being associated with a corresponding one of the N data symbols; and a two-phase acknowledgement output line for transmitting a two-phase acknowledgement signal comprising a voltage transition indicating that a data symbol has been successfully received and permitting a new data symbol to be transmitted, wherein the reception circuit is configured to generate each data symbol by detecting a voltage transition only on a corresponding one of the data input lines independently of the voltage state of the other data input lines; and N data output lines, each of the data output lines being associated with a corresponding one of the N data symbols, wherein the reception circuit is configured to transmit each data symbol by applying a first logic state on a corresponding one of the data output lines.

10. The two-phase to four-phase converter of claim 9, further comprising a four-phase acknowledgement input line for receiving a four-phase acknowledgement signal indicating that a data symbol has been successfully received, wherein the four-phase acknowledgement signal comprises, in response to the reception of each data symbol, the application of a second logic state on the four-phase acknowledgement input line, and in response to the transmission of a spacer by the reception circuit, the application of a first logic state on the four-phase acknowledgement output line.

11. The two-phase to four-phase converter of claim 9, comprising, for each data input line:

a first latch having an input coupled to the data input line;
a second latch having an input coupled to an output of the first latch; and
a logic gate coupled to the output of the first latch and to an output of the second latch and configured to generate a data symbol, wherein the first latches are enabled by a first logic state of the four-phase acknowledgement signal and the second latches are enabled by a second logic state of the four-phase acknowledgement signal.

12. The two-phase to four-phase converter of claim 11, further comprising:

a two-phase acknowledgement generation circuit configured to generate the two-phase acknowledgement signal by detecting a transition at the output of one of the second latches.

13. A two-phase to four-phase asynchronous protocol converter comprising:

a two-phase asynchronous reception circuit for receiving data encoded according to a two-phase asynchronous protocol, the reception circuit comprising:

N data input lines, where N is an integer equal to 3 or more, wherein the reception circuit is capable of receiving N unique data symbols, each symbol corresponding to a binary value of at least two bits, each of the data input lines being associated with a corresponding one of the N data symbols; and a two-phase acknowledgement output line for transmitting a two-phase acknowledgement signal comprising a voltage transition indicating that a data symbol has been successfully received and permitting a new data symbol to be transmitted, wherein the reception circuit is configured to generate each data symbol by detecting a voltage transition only on a corresponding one of the data input lines independently of the voltage state of the other data input lines;

N data output lines, each of the data output lines being associated with a corresponding one of the N data symbols, wherein the reception circuit is configured to transmit each data symbol by applying a first logic state on a corresponding one of the data output lines, and wherein the two-phase to four-phase converter further comprises, for each data input line:

a first latch having an input coupled to the data input line;
a second latch having an input coupled to an output of the first latch; and
a logic gate coupled to the output of the first latch and to an output of the second latch and configured to generate a data symbol, wherein the first latches are enabled by a first logic state of the four-phase acknowledgement signal and the second latches are enabled by a second logic state of the four-phase acknowledgement signal.

14. A data link comprising:

a two-phase asynchronous transmission circuit for transmitting data over a wired interface according to a two-phase asynchronous protocol, the transmission circuit comprising:

N data output lines, where N is an integer equal to 3 or more, wherein the transmission circuit is capable of transmitting N unique data symbols, each symbol corresponding to a binary value of at least two bits, each of the output lines being associated with a corresponding one of the N data symbols; and a two-phase acknowledgement input line for receiving a two-phase acknowledgement signal comprising a voltage transition indicating that a data symbol has been successfully received and permitting a new data symbol to be transmitted, the transmission circuit being configured to transmit each data symbol by applying a voltage transition only to a corresponding output line independently of the voltage state of the other output lines;

a two-phase asynchronous reception circuit for receiving data encoded according to a two-phase asynchronous protocol, the reception circuit comprising:

N data input lines, where N is an integer equal to 3 or more, wherein the reception circuit is capable of receiving N unique data symbols, each symbol corresponding to a binary value of at least two bits, each of the data input lines being associated with a corresponding one of the N data symbols; and a two-phase acknowledgement output line for transmitting a two-phase acknowledgement signal comprising a voltage transition indicating that a data symbol has been successfully received and permitting a new data symbol to be transmitted, wherein the reception circuit is configured to generate each data symbol by detecting a voltage transition on a corresponding one of the data input lines independently of the voltage state of the other data input lines; and a wired interface comprising N lines interconnecting the N output lines of the two-phase transmission circuit to the N input lines of the two-phase reception circuit.

15. The data transmission link of claim 14, comprising:
a four-phase to two-phase asynchronous protocol converter comprising said two-phase asynchronous transmission circuit; and
a two-phase to four-phase asynchronous protocol converter comprising said two-phase asynchronous reception circuit.

16. The data transmission link of claim 14, wherein the wired interface comprises a three dimensional interface.

\* \* \* \* \*